US012538578B2

(12) United States Patent
Li et al.

(10) Patent No.: US 12,538,578 B2
(45) Date of Patent: Jan. 27, 2026

(54) DISPLAY DEVICE

(71) Applicant: SUZHOU CHINA STAR OPTOELECTRONICS TECHNOLOGY CO., LTD., Suzhou (CN)

(72) Inventors: Birong Li, Suzhou (CN); Li Chai, Suzhou (CN)

(73) Assignee: SUZHOU CHINA STAR OPTOELECTRONICS TECHNOLOGY CO., LTD., Suzhou (CN)

( * ) Notice: Subject to any disclaimer, the term of this patent is extended or adjusted under 35 U.S.C. 154(b) by 393 days.

(21) Appl. No.: 18/272,011

(22) PCT Filed: Apr. 27, 2023

(86) PCT No.: PCT/CN2023/091153
§ 371 (c)(1),
(2) Date: Jul. 12, 2023

(87) PCT Pub. No.: WO2024/216665
PCT Pub. Date: Oct. 24, 2024

(65) Prior Publication Data
US 2024/0387558 A1 Nov. 21, 2024

(30) Foreign Application Priority Data
Apr. 19, 2023 (CN) .......................... 202310422878.3

(51) Int. Cl.
*H10D 86/60* (2025.01)
*H10D 86/40* (2025.01)
(52) U.S. Cl.
CPC ........... *H10D 86/60* (2025.01); *H10D 86/441* (2025.01)
(58) Field of Classification Search
CPC ........................... H10D 86/60; H10D 86/441
See application file for complete search history.

(56) References Cited

U.S. PATENT DOCUMENTS

| 11,329,072 | B2* | 5/2022 | Chen | H10D 86/441 |
| 11,393,883 | B2* | 7/2022 | Bae | H10K 59/131 |
| 2016/0155755 | A1* | 6/2016 | Liu | H10D 86/60 |
| | | | | 257/72 |

* cited by examiner

*Primary Examiner* — Anne M Hines
(74) *Attorney, Agent, or Firm* — The Roy Gross Law Firm, LLC; Roy D. Gross

(57) ABSTRACT

The present disclosure discloses a display device, in which a binding connection portion is disposed on a side of an additional conductive portion away from a substrate, and a spacing layer includes an opening disposed at least above the binding connection portion. At least one side surface of the additional conductive portion protrudes from a side surface of the binding connection portion along a first direction, which is parallel to the substrate and perpendicular to an extension direction of the signal wiring. A binding electrode extends into the opening, and is connected to either the binding connection portion, or both of the binding connection portion and the additional conductive portion.

20 Claims, 6 Drawing Sheets

DISPLAY DEVICE

CROSS REFERENCE TO RELATED APPLICATIONS

This application is a national Stage of International Application No. PCT/CN2023/091153, filed on Apr. 27, 2023, which claims priority to and the benefit of Chinese Patent Application No. 202310422878.3, filed on Apr. 19, 2023. The disclosures of the aforementioned applications are incorporated herein by reference in their entireties.

TECHNICAL FIELD

The disclosure relates to display technology, in particular to a display device.

BACKGROUND

Electrophoretic display devices, abbreviated as electronic paper(s), have characteristics of low energy consumption, high readability under sunlight, low production cost, and suitability for flexible display technology compared with other display technologies.

At present, electronic paper display devices have also begun to use large-size thin-film transistor liquid crystal display devices (TFT-LCD) for production.

In a 4Mask process of a thin film transistor (TFT) array substrate, the signal wirings or lines disposed in the binding area are formed by twice wet etching processes, in which a side etching phenomenon is prone to occur, resulting in a smaller width of the signal wiring. When a via hole above the signal wiring is formed to connect the signal wiring and the binding terminal, the contact area between the binding terminal and the signal wiring may be reduced. Moreover, if the via hole deviates from the signal wiring caused by the process fluctuation, the contact area between the binding terminal and the signal wiring may further be reduced, which increases the connection resistance between the binding terminal and the signal wiring, and affects the signal transmission effect.

SUMMARY

Embodiments of the present disclosure provide a display device, which can reduce the contact resistance between the binding electrode and the binding connection portion by increasing the contact area among a binding electrode, and a binding connection portion and an additional conductive portion, thus improving the signal transmission effect.

Embodiments of the present disclosure provide a display device, which may include a display area and a binding area disposed at at least one side of the display area;
the display device may include:
a substrate;
a first conductive layer disposed on the substrate, and including an additional conductive portion disposed in the binding area;
a second conductive layer disposed on a side of the first conductive layer away from the substrate, and including a signal wiring disposed at least in the binding area, in which the signal wiring may include a binding connection portion disposed on a side of the additional conductive portion away from the substrate;
a spacing layer disposed on a side of the second conductive layer away from the first conductive layer, and including an opening disposed at least above the binding connection portion; and
a third conductive layer disposed on a side of the spacing layer away from the second conductive layer, and including a binding electrode disposed in the binding area;
in which at least one side surface of the additional conductive portion may protrude from a side surface of the binding connection portion along a first direction, and the first direction may be parallel to the substrate and perpendicular to an extension direction of the signal wiring; and in which the binding electrode may extend into the opening, and may be connected to either the binding connection portion, or both of the binding connection portion and the additional conductive portion.

In an embodiment of the present disclosure, an orthographic projection of the binding connection portion on the substrate may be located within an orthographic projection of the additional conductive portion on the substrate.

In an embodiment of the present disclosure, a width of the additional conductive portion along the first direction may be greater than or equal to a width of a side of the opening close to the substrate along the first direction.

In an embodiment of the present disclosure, a width of the additional conductive portion along the first direction may be greater than or equal to 8 microns.

In an embodiment of the present disclosure, an orthographic projection of the binding connection portion on the substrate may partially overlap with an orthographic projection of the additional conductive portion on the substrate.

In an embodiment of the present disclosure, the binding connection portion may include a first side surface and a second side surface disposed opposite to each other along the first direction, and the additional conductive portion may include a third side surface and a fourth side surface disposed opposite to each other along the first direction; and
the first side surface may be disposed at a side of the third side surface away from the additional conductive portion, and the fourth side surface may be disposed at a side of the second side surface away from the binding connection portion.

In an embodiment of the present disclosure, the binding electrode may cover at least a part of a surface of the binding connection portion away from the substrate.

In an embodiment of the present disclosure, the binding electrode may cover at least a part of a surface of the binding connection portion away from the substrate, and a part of a surface of the additional conductive portion away from the substrate.

In an embodiment of the present disclosure, the second conductive layer may include at least two signal wirings; between adjacent two signal wirings, an orthographic projection of the additional conductive portion between one of the adjacent two signal wirings and the substrate on the substrate may do not overlap with an orthographic projection of another of the adjacent two signal wirings on the substrate.

In an embodiment of the present disclosure, the display device may further include an insulation layer disposed between the first conductive layer and the second conductive layer; the first conductive layer may further include a gate disposed in the display area, the second conductive layer may further include a source and a drain disposed in the display area, and the third conductive layer may further include a pixel electrode disposed in the display area; and the insulation layer may include a first insulation sub-layer disposed between the additional conductive portion and the binding connection portion, and a second insulation sublayer covering the gate.

In an embodiment of the present disclosure, the opening may further pass through the insulation layer, and the binding electrode may pass through the opening and may be connected to the additional conductive portion.

In an embodiment of the present disclosure, a width of the binding connection portion along the first direction may be greater than 3 microns and less than 10 microns.

In an embodiment of the present disclosure, a material of the second conductive layer may be copper.

In an embodiment of the present disclosure, a display device may include a display area and a binding area disposed at at least one side of the display area;
the display device may include:
a substrate;
a first conductive layer disposed on the substrate, and including an additional conductive portion disposed in the binding area;
a second conductive layer disposed on a side of the first conductive layer away from the substrate, and including a signal wiring disposed at least in the binding area, in which the signal wiring may include a binding connection portion disposed on a side of the additional conductive portion away from the substrate;
a spacing layer disposed on a side of the second conductive layer away from the first conductive layer, and including an opening disposed at least above the binding connection portion; and
a third conductive layer disposed on a side of the spacing layer away from the second conductive layer, and including a binding electrode disposed in the binding area;
in which at least one side surface of the additional conductive portion may protrude from a side surface of the binding connection portion along a first direction, and the first direction may be parallel to the substrate and perpendicular to an extension direction of the signal wiring; and in which the binding electrode may extend into the opening, and may be connected to either the binding connection portion, or both of the binding connection portion and the additional conductive portion; and in which the binding electrode may cover at least part or all of a surface of the binding connection portion away from the substrate.

In an embodiment of the present disclosure, an orthographic projection of the binding connection portion on the substrate may be located within an orthographic projection of the additional conductive portion on the substrate.

In an embodiment of the present disclosure, a width of the additional conductive portion along the first direction may be greater than or equal to a width of a side of the opening close to the substrate along the first direction.

In an embodiment of the present disclosure, a width of the additional conductive portion along the first direction may be greater than or equal to 8 microns.

In an embodiment of the present disclosure, an orthographic projection of the binding connection portion on the substrate may partially overlap with an orthographic projection of the additional conductive portion on the substrate.

In an embodiment of the present disclosure, the binding connection portion may include a first side surface and a second side surface disposed opposite to each other along the first direction, and the additional conductive portion may include a third side surface and a fourth side surface disposed opposite to each other along the first direction; and in which the first side surface may be disposed at a side of the third side surface away from the additional conductive portion, and the fourth side surface may be disposed at a side of the second side surface away from the binding connection portion.

In an embodiment of the present disclosure, the binding electrode may cover at least a part of a surface of the binding connection portion away from the substrate, and a part of a surface of the additional conductive portion away from the substrate.

Beneficial Effects

Compared to the existing art, the embodiments of the present disclosure, by disposing an additional conductive portion below a binding connection portion, and the additional conductive portion protruding from the binding connection portion in a direction perpendicular to an extension direction of a signal wiring, enables an opening to expose the binding connection portion and a protrusion part of the additional conductive portion below the binding connection portion on a condition that a size of the opening is greater than a width of the binding connection portion or the position of the opening has deviation during the process of forming the opening, so that the binding electrode can be connected to the additional conductive portion on the basis of being connected to the binding connection portion, that is, the binding electrode can be connected to both of the binding connection portion and the additional conductive portion, which increases the contact area, reduces the connection resistance between the binding electrode and the signal wiring, and improves the signal transmission effect.

DESCRIPTION OF DRAWINGS

Technical solutions and other beneficial effects of the present disclosure will be apparent through detailed description of specific implementation of the present disclosure in combination with attached drawings.

DETAILED DESCRIPTION OF EMBODIMENTS

In combination with drawings in the embodiments of the present disclosure, technical solutions in the embodiments of the present disclosure will be described clearly and completely. Apparently, the described embodiments are only part of the embodiments of the present disclosure, not all of them. Based on the embodiments of the present disclosure, all other embodiments obtained by those skilled in the art without creative effort belong to a scope of the present disclosure.

The following disclosure provides many different implementation methods or examples to implement different structures of the present disclosure. In order to simplify the present disclosure, specific examples of components and arrangement will be described below. Of course, they are only examples and are not intended to limit the present disclosure. In addition, reference numbers and/or reference letters may be repeated in different examples of the present disclosure for the purpose of simplification and clarity, which does not indicate the relationship between the various embodiments and/or arrangement discussed. Moreover, the present disclosure provides examples of various specific processes and materials, but those skilled in the art may be aware of other processes and/or the use of other materials.

Figure 1:
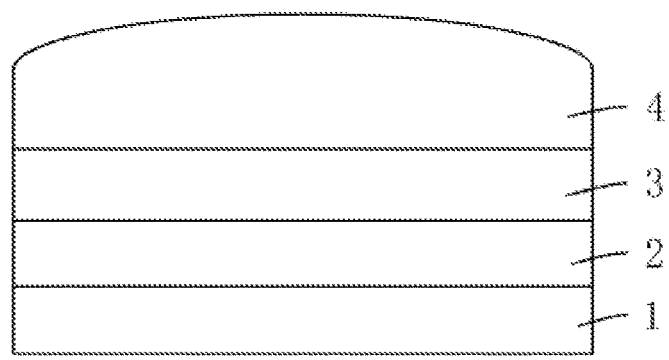
FIGS. 1-6 are schematic structural diagrams of a metal layer of a display device in an etching process according to the prior art.
Figure 2:
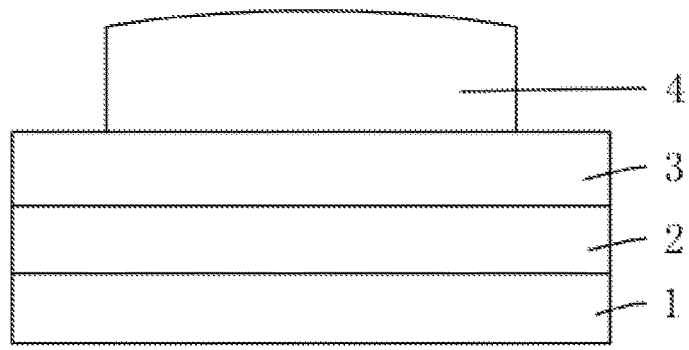
Figure 3:
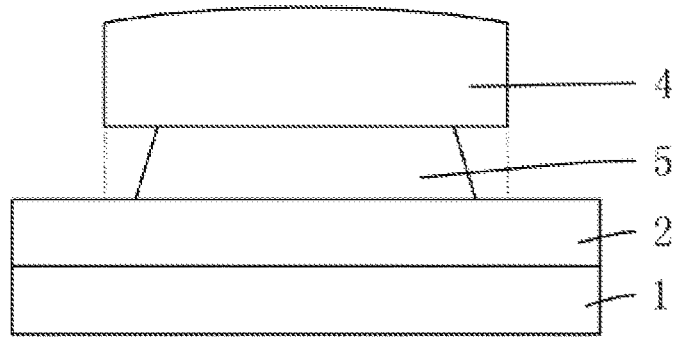
Figure 4:
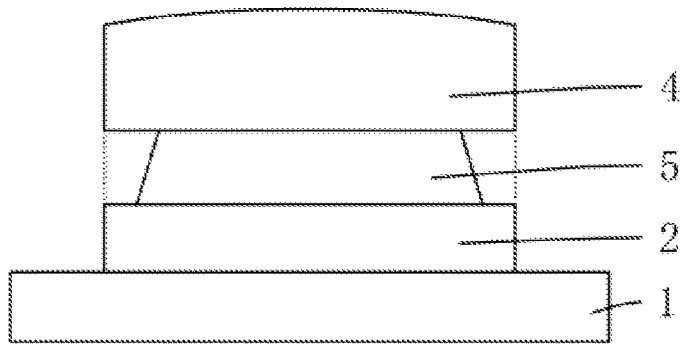
Figure 5:
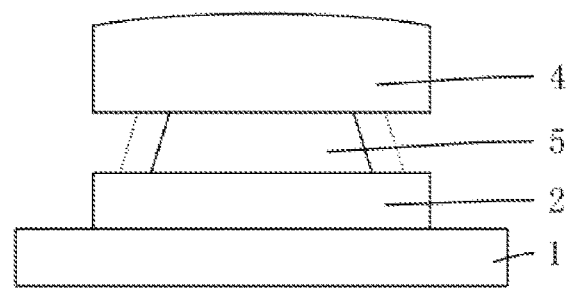
Figure 6:
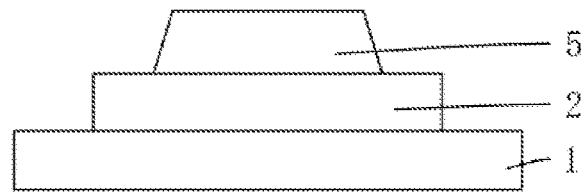
Figure 7:
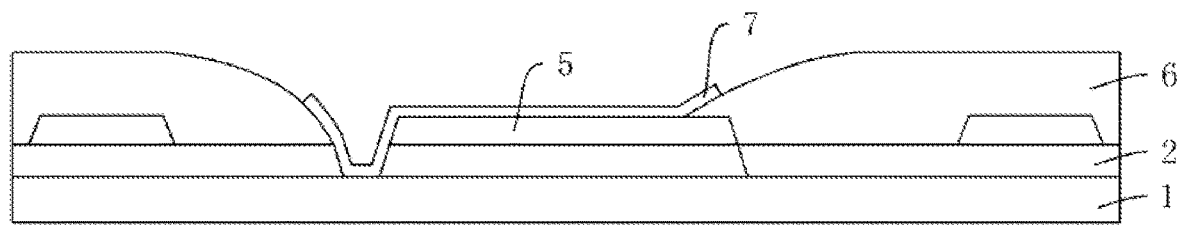
FIG. 7 is a schematic structural diagram of a display device according to the prior art.

Referring to FIGS. 1-7, during a 4Mask process of a display device in the prior art, an insulating dielectric layer 2, a metal layer 3, and a photoresist layer 4 may be sequentially formed on a substrate 1, as shown in FIG. 1. The photoresist layer 4 is patterned, as shown in FIG. 2. Then, the metal layer 3 is etched by a first wet etching process to form a signal wiring 5, as shown in FIG. 3. However, in the subsequent process, the signal wiring 5 may further be etched by another wet etching process that is a second wet etching process. In the second wet etching process, there may be a significant degree of side etching of the signal wiring 5 due to the material of the signal wiring 5 being copper, which reduces a width of the signal wiring 5, resulting in a smaller width than a preset width of the signal wiring 5, as shown in FIG. 5. Then, the photoresist layer 4 is removed to complete the etching, as shown in FIG. 6. An organic insulation layer 6 and a binding terminal 7 are formed on the signal wiring 5, and the binding terminal 7 passes through a via hole of the organic insulation layer 6 and is lap-jointed with the signal wiring 5, as shown in FIG. 7. Due to the decrease of the width of the signal wiring 5, the contact area between the signal wiring 5 and the binding terminal 7 may decrease, which increases the contact resistance between the signal wiring 5 and the binding terminal 7, and reduces the signal transmission effect. Furthermore, when the position of the via hole in the organic insulation layer 6 deviates during the etching process, the contact area between the binding terminal 7 and the signal wiring 5 may further decrease.

Figure 8:
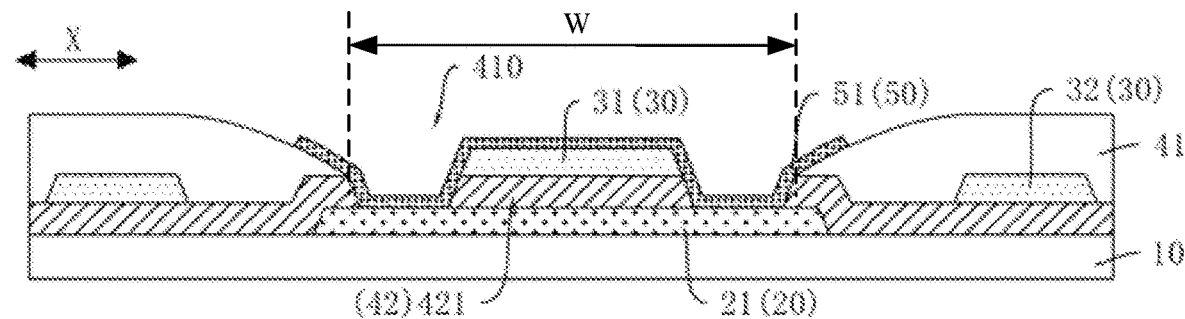
FIG. 8 is a schematic structural diagram of a display device in a binding area according to an embodiment of the present disclosure.
Figure 9:
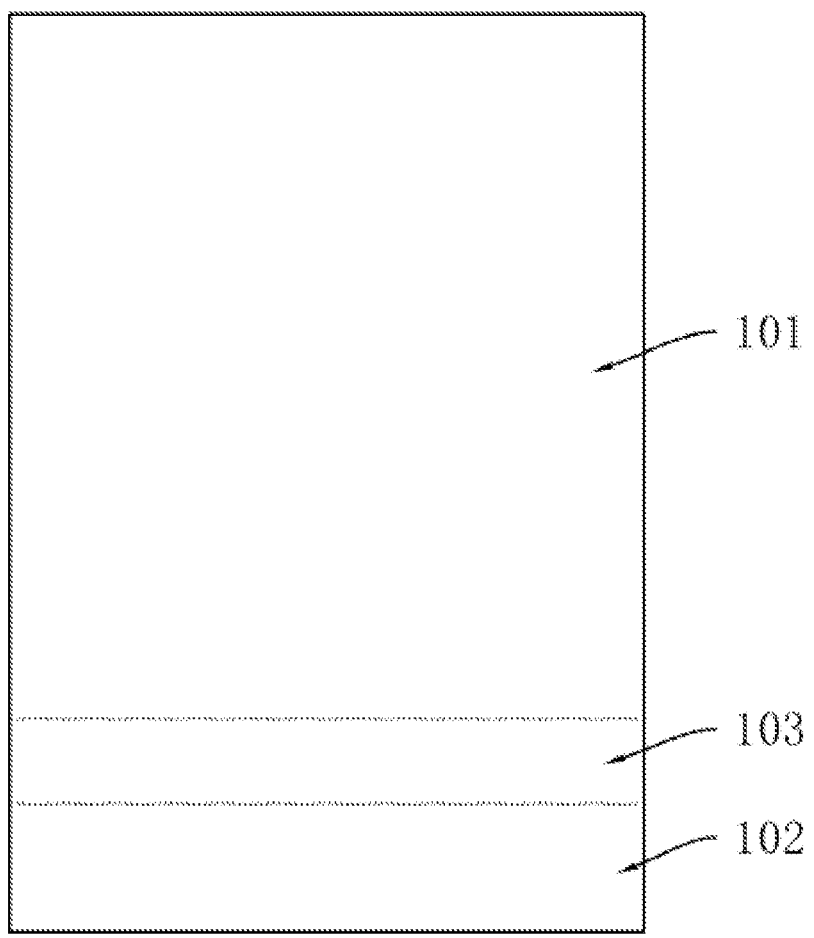
FIG. 9 is a schematic planar distribution diagram of a display device according to an embodiment of the present disclosure.

Referring to FIG. 8 and FIG. 9, embodiments of the present disclosure provide a display device, which includes a display area 101 and a binding area 102 disposed at a side of the display area 101. The display device further includes a substrate 10, a first conductive layer 20, a second conductive layer, a spacing layer 41, and a third conductive layer 50.

The first conductive layer 20 is disposed on the substrate 10 and includes an additional conductive portion 21 disposed in the binding area 102. The second conductive layer is disposed on a side of the first conductive layer 20 away from the substrate 10, and includes at least a signal wiring 30 disposed in the binding area 102. The signal wiring 30 includes a binding connection portion 31 disposed on a side of the additional conductive portion 21 away from the substrate 10. The spacing layer 41 is disposed on a side of the second conductive layer away from the first conductive layer 20, and includes an opening 410 disposed at least above the binding connection portion 31. The third conductive layer 50 is disposed on a side of the spacing layer 41 away from the second conductive layer, and includes a binding electrode 51 disposed in the binding area 102.

Furthermore, at least one side surface of the additional conductive portion 21 protrudes from a side surface of the binding connection portion 31 along a first direction X. The first direction X is parallel to the substrate 10 and perpendicular to an extension direction of the signal wiring 30. The binding electrode 51 extends into the opening 410. The binding electrode 51 is connected to either the binding connection portion 31, or both of the binding connection portion 31 and the additional conductive portion 21.

In the implementation and application process, the embodiments of the present disclosure, by disposing the additional conductive portion 21 below the binding connection portion 31, and the additional conductive portion 21 protruding from the binding connection portion 31 in the direction parallel to the substrate 10 and perpendicular to the extension direction of the signal wiring 30, enables the opening 410 to expose the binding connection portion 31 and a protrusion part of the additional conductive portion 21 below the binding connection portion 31 on a condition that a size of the opening 410 is greater than a width of the binding connection portion 31 or the position of the opening 410 has deviation during the process of forming the opening 410, so that the binding electrode 51 can be connected to the additional conductive portion 21 on the basis of being connected to the binding connection portion 31, that is, the binding electrode 51 can be connected to both of the binding connection portion 31 and the additional conductive portion 21, which can increase the contact area to increase the effective binding area, reduce the connection resistance between the binding electrode 51 and the signal wiring 30, and improve the signal transmission effect.

Referring to FIG. 8, FIG. 9, FIG. 10, and FIG. 11, the display device includes the display area 101 and the binding area 102 disposed at at least one side of the display area 101. The binding area 102 disposed on one side of the display area 101 is taken as an example of the embodiments of the present disclosure for illustration, as shown in FIG. 9. It can be understood that the display device may also include at least one functional area 103 disposed between the display area 101 and the binding area 102, such as a fanout wiring area and/or a bending area.

The display device includes the first conductive layer 20 disposed on the substrate 10, an insulation layer 42 disposed on the first conductive layer 20, the second conductive layer disposed on the insulation layer 42, the spacing layer 41 disposed on the second conductive layer, and the third conductive layer 50 disposed on the spacing layer 41.

The first conductive layer 20 includes a gate disposed in the display area 101 (not shown in the figures) and the additional conductive portion 21 disposed in the binding area 102. The insulation layer 42 covers a side of the first conductive layer 20 away from the substrate 10.

The second conductive layer is disposed on the insulation layer 42, and includes a source and a drain disposed in the display area 101, and the signal wiring 30 at least disposed in the binding area 102. It should be noted that the signal wiring 30 may extend into the bending area, the fanout wiring area, and even the display area 101, so as to transmit signals to the display area 101. Or, the signal wiring 30 may be connected to the wirings of the display device in the display area 101 through a via hole, or through other methods to achieve signal transmission, which is not limited here.

Optionally, a material of the second conductive layer may be copper.

The signal wiring 30 includes the binding connection portion 31 disposed in the binding area 102, and the binding connection portion 31 is disposed on a side of the additional conductive portion 21 away from the substrate 10. The insulation layer 42 includes a first insulation sub-layer 421 disposed between the binding connection portion 31 and the additional conductive portion 21. It should be noted that the display device further includes a semiconductor layer disposed between the first conductive layer 20 and the second conductive layer, and the semiconductor layer includes an active layer disposed in the display area 101. The insulation layer 42 may further include a second insulation sub-layer disposed between the gate and the active layer.

The spacing layer 41 is disposed on a side of the second conductive layer away from the first conductive layer 20, and may be used as an insulation layer and/or a planarization layer in the display area 101. The spacing layer 41 includes the opening 410 disposed in the binding area 102, and the opening 410 is disposed at least above the binding connection portion 31.

Optionally, the spacer layer 41 may be a polymer film.

It should be noted that the first direction X is defined to be parallel to the substrate 10 and perpendicular to the extension direction of the signal wiring 30. Because the second conductive layer may be formed by multiple wet etching processes, the side etching of the second conductive layer is prone to occur, resulting in the width of the signal wiring 30 being smaller than the preset width of the signal wiring 30, causing a width W of the opening 410 along the first direction X to be greater than the width of the binding connection 31 along the first direction X.

In the embodiments of the present disclosure, at least one side surface of the additional conductive portion 21 protrudes from the side surface of the binding connection portion 31 along the first direction X. In a process of forming the opening 410, when the width of the opening 410 along the first direction X is greater than the width of the binding connection portion 31 along the first direction X, a part of the insulation layer 42 in the area corresponding to the opening 410 is removed to expose the part of the additional conductive portion 21 protruding from the side surface of the binding connection portion 31. That is, the opening 410 further passes through the insulation layer 42 and the second conductive layer and insulation layer 42, and exposes a side surface of the binding connection portion 31 and an upper surface of the protrusion part of the additional conductive portion 21. A part of the insulation layer 42 disposed between the additional conductive portion 21 and the binding connection portion 31 is not removed, forming the first insulation sub-layer 421 disposed between the additional conductive portion 21 and the binding connection portion 31.

When the second conductive layer includes at least two signal wirings 30, among adjacent two signal wirings 30, an orthographic projection of the additional conductive portion 21 disposed between one of the adjacent two signal wirings 30 and the substrate 10 does not overlap with an orthographic projection of another of the adjacent two signal wirings 30 on the substrate 10, so as to avoid the signal interference of the additional conductive portion 21 on the adjacent two signal wirings 30.

The opening 410 may have a shape selected from circular, triangular, rectangular, or other polygons, which is not limited here. The opening 410 having a shape of circular is taken as an example of the embodiments of the present disclosure for description.

The third conductive layer 50 is disposed on the spacing layer 41. The third conductive layer 50 includes a pixel electrode disposed in the display area 101 and connected to the drain or the source, and the binding electrode 51 disposed in the binding area 102. The binding electrode 51 extends into the opening 410. The binding electrode 51 is connected to either the binding connection portion 31, or both of the binding connection portion 31 and the additional conductive portion 21, so that the binding electrode 51 can be connected to the additional conductive portion 21 on the basis of being connected to the binding connection portion 31. That is, the binding electrode 51 may be connected to both of the binding connection portion 31 and the additional conductive portion 21, which can increase the contact area, reduce the connection resistance between the binding electrode 51 and the signal wiring 30, and improve the signal transmission effect.

It can be understood that the present disclosure, by designing the additional conductive portion 21, ensures the contact effect between the binding electrode 51 and the binding connection portion 31, which can reduce the width of the binding connection portion 31 to save layout space of wirings. In some embodiments, the width of the binding connection portion 31 along the first direction X may be greater than 3 microns and less than 10 microns.

Optionally, a material of the third conductive layer 50 may be indium tin oxide.

Figure 10:
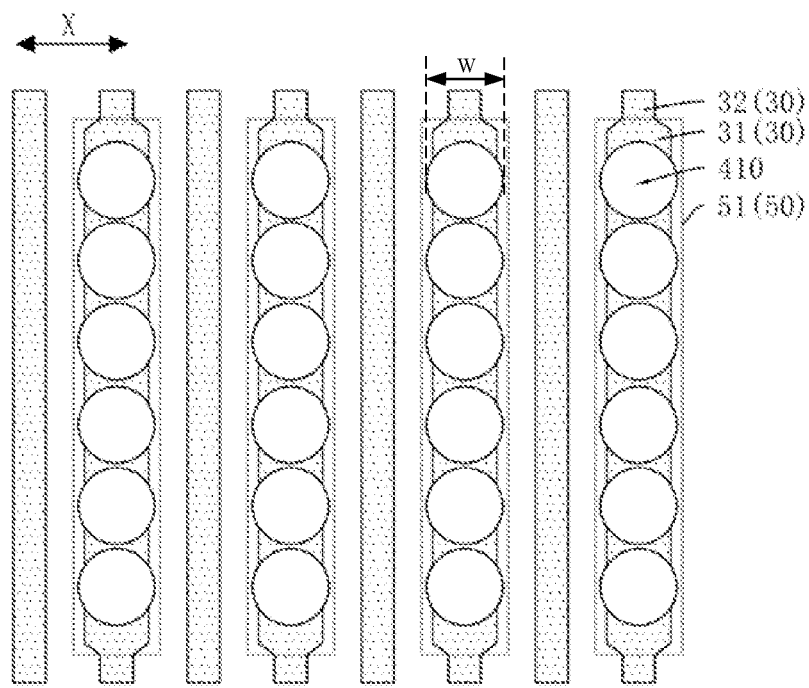
FIG. 10 is a schematic structural diagram of a signal wiring of a display device according to an embodiment of the present disclosure.
Figure 11:
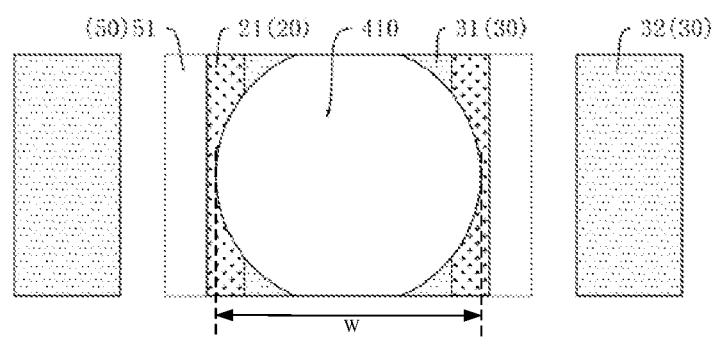
FIG. 11 is a schematic structural diagram of a binding connection portion of a display device according to an embodiment of the present disclosure.

Referring to FIG. 8, FIG. 10, and FIG. 11, in some embodiments of the present disclosure, an orthographic projection of the binding connection portion 31 on the substrate 10 is located within the orthographic projection of the additional conductive portion 21 on the substrate 10, and the width of the opening 410 along the first direction X is greater than the width of the binding connection portion 31 along the first direction X. The binding electrode 51 extends into the opening 410, and covers an upper surface of the binding connection portion 31 away from the substrate 10, a side surface of the binding connection portion 31 connected to the upper surface of the binding connection portion 31, and a part of a surface of the additional conductive portion 21 away from the substrate 10, so as to increase the contact area, reduce the connection resistance between the binding electrode 51 and the signal wiring 30, and improve the signal transmission effect.

In this embodiment, a width of the additional conductive portion 21 along the first direction X is greater than or equal to a width W of the opening 410 at a side of the substrate 10 along the first direction X, to ensure that the binding electrode 51 can overlap with the binding connection portion 31 and the additional conductive portion 21 in the opening 410.

Due to process limitations, the width of the side of the opening 410 close to the substrate 10 along the first direction X may be greater than or equal to 8 microns, and the width of the additional conductive portion 21 along the first direction X may be greater than or equal to 8 microns.

It should be noted that the binding electrode 51 covers the upper surface of the protrusion part of the additional conductive portion 21 relative to the binding connection portion 31.

In view of foregoing, in this embodiment, due to the width of the opening 410 along the first direction X being greater than the width of the binding connection portion 31 along the first direction X, more parts of the binding connection portion 31 along the first direction X can expose to achieve the complete and effective contact between the binding electrode 51 and the binding connection portion 31, thus improving the signal transmission effect.

Figure 12:
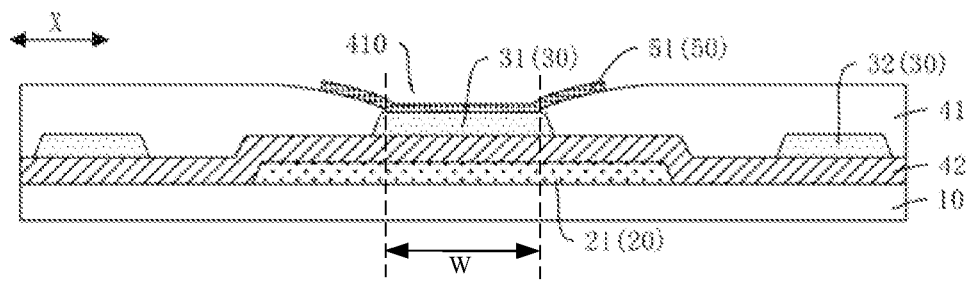
FIG. 12 is another schematic structural diagram of a display device in a binding area according to an embodiment of the present disclosure.

Referring to FIG. 12, in another embodiment of the present disclosure, which differs from the above-mentioned embodiments in that the orthographic projection of the binding connection portion 31 on the substrate 10 partially overlaps with the orthographic projection of the additional conductive portion 21 on the substrate 10, one side surface of the additional conductive portion 21 protrudes from one side surface of the binding connection portion 31 along the first direction X, and another side surface of the binding connection portion 31 protrudes from another side surface of the additional conductive portion 21 along the first direction X.

Specifically, the binding connection portion 31 includes a first side surface 311 and a second side surface 312 disposed opposite to each other along the first direction X, and the additional conductive portion 21 includes a third side surface 211 and a fourth side surface 212 disposed opposite to each other along the first direction X. The first side surface 311 and the third side surface 211 face the same side, and the second side surface 312 and the fourth side surface 212 face the same side.

In this embodiment, the first side surface 311 is disposed at a side of the third side surface 211 away from the additional conductive portion 21, and the fourth side surface 212 is disposed at a side of the second side surface 312 away from the binding connection portion 31.

The opening 410 is disposed above the binding connection portion 31 and the additional conductive portion 21. The opening 410 exposes a part of an upper surface of the binding connection portion 31 away from the substrate 10 and a part of an upper surface of the additional conductive portion 21 away from the substrate 10. The binding electrode 51 covers the part of the upper surface of the binding connection portion 31 away from the substrate 10 and the part of the upper surface of the additional conductive portion 21 away from the substrate 10.

Based on the above, in this embodiment, due to the increase of the total area of the binding connection portion 31 and the additional conductive portion 21, even if there is a misalignment or deviation between the opening 410 and the binding connection portion 31, the opening 410 exposes the binding connection portion 31 and the additional conductive portion 21, increasing the contact area between the binding electrode 51, and the binding connection portion 31 and the additional conductive portion 21, reducing the connection resistance between the binding electrode 51 and the signal wiring 30, and further improving the signal transmission effect.

Figure 13:
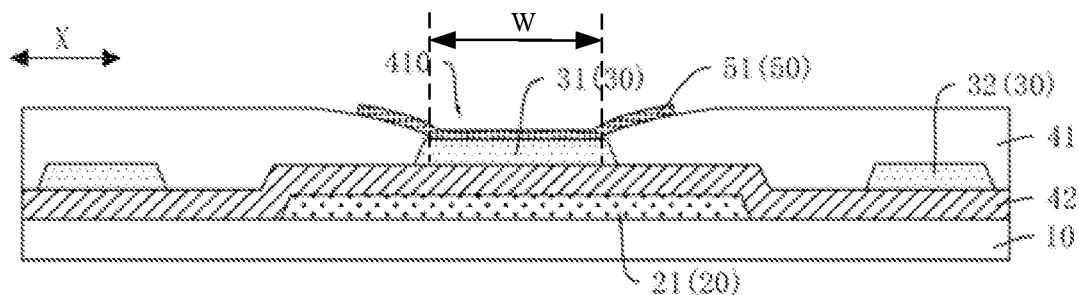
FIG. 13 is another schematic structural diagram of a display device in a binding area according to an embodiment of the present disclosure.
Figure 14:
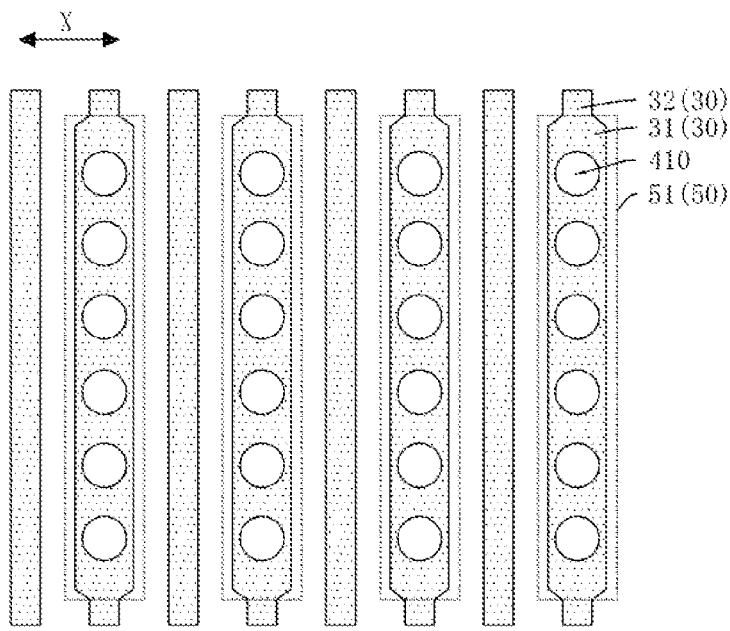
FIG. 14 is another schematic planar distribution diagram of a signal wiring of a display device according to an embodiment of the present disclosure.
Figure 15:
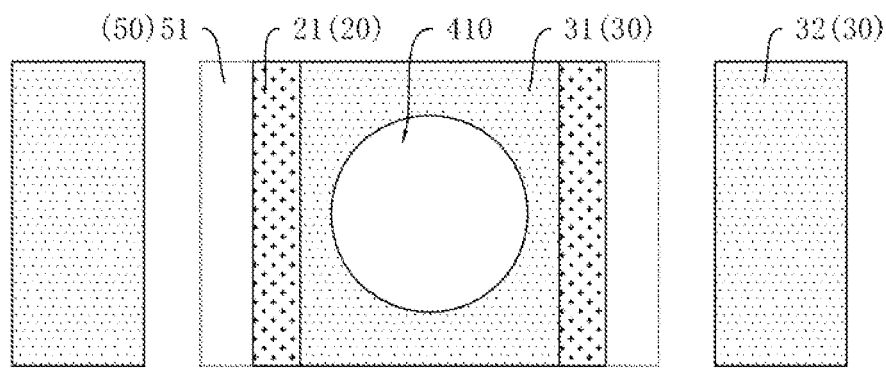
FIG. 15 is another schematic structural diagram of a binding connection portion of a display device according to an embodiment of the present disclosure.

Referring to FIGS. 13 to 15, another embodiment of the present disclosure differs from the above-mentioned embodiments in that the width of the opening 410 along the first direction X is less than or equal to the width of the binding connection portion 31 along the first direction X, and the binding electrode 51 extends into the opening 410 and is lap-jointed with the binding connection portion 31.

It should be noted that the embodiment of the present disclosure increases the total covered area of the binding connection portion 31 and the additional conductive portion 21 by designing the additional conductive portion 21 below the binding connection portion 31, so that the binding electrode 51 can be connected to the binding connection portion 31 and the additional conductive portion 21 on a condition that the width of the binding connection portion 31 becomes narrower or the position of the opening 410 deviates, increasing the contact area between the binding electrode 51, and the binding connection portion 31 and the additional conductive portion 21, reducing the contact resistance between the binding connection portion 31 and the binding electrode 51, and further improving the signal transmission effect.

Furthermore, the display device includes a conductive material layer disposed on the binding electrode 51, and a driver chip disposed on a side of the conductive material layer away from the binding electrode 51. That is, the driver chip is connected to the binding electrode 51 through the conductive material layer to achieve signal transmission.

Figure 16:
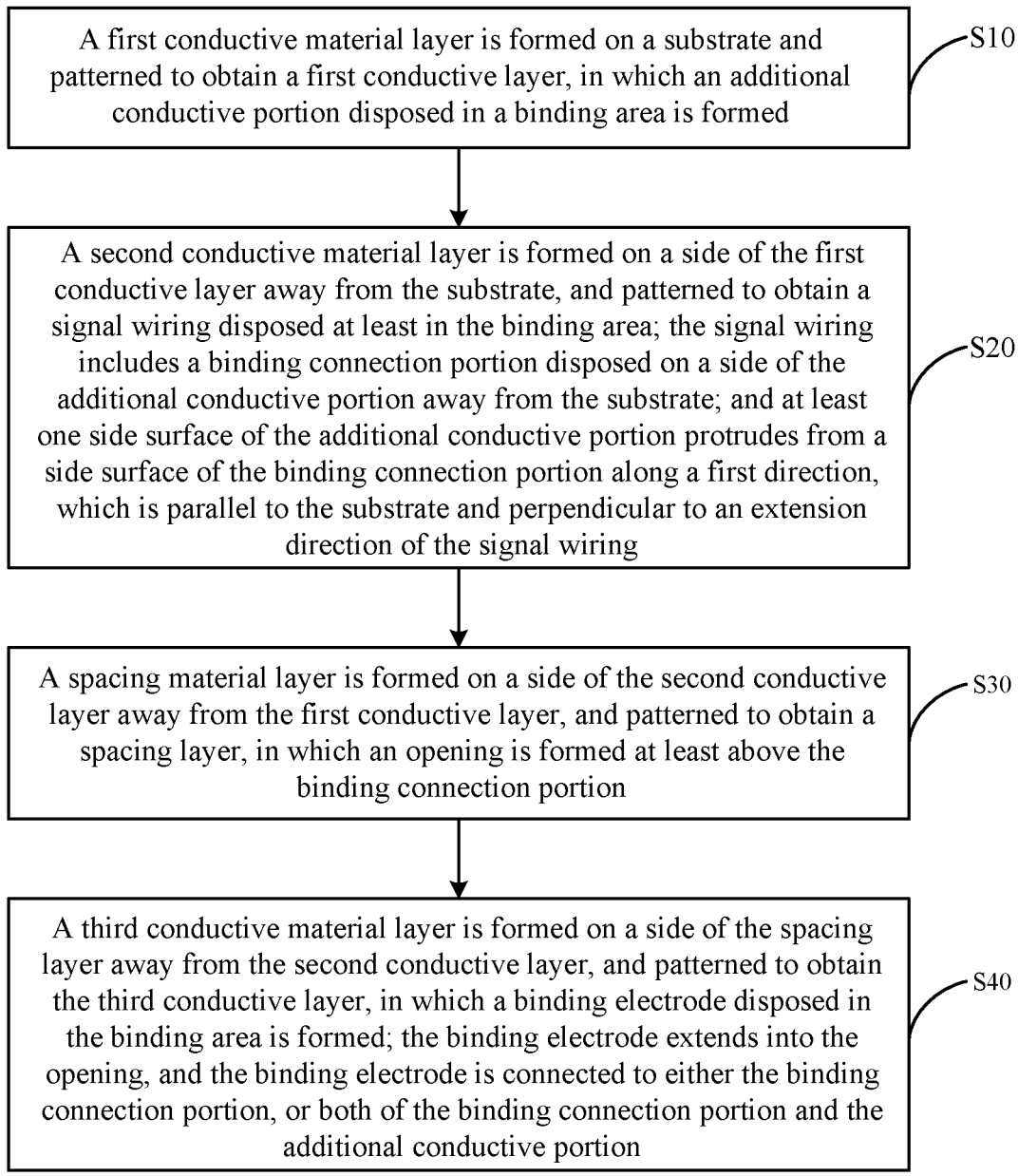
FIG. 16 is a flowchart of a manufacturing method of a display device according to an embodiment of the present disclosure.

Moreover, the embodiments of the present disclosure further provide a manufacturing method of the display device described in the above-mentioned embodiments. Referring to FIG. 8, FIG. 9, and FIG. 16, the display device includes the display area 101 and the binding area 102 disposed at at least one side of the display area 101.

The manufacturing method of the display device includes the following steps.

Step S10, a first conductive material layer is formed on the substrate 10 and patterned to obtain the first conductive layer 20, in which the additional conductive portion 21 disposed in the binding area 102 is formed.

At step S10, the first conductive material layer is patterned to form the gate disposed in the display area 101 and the additional conductive portion 21 disposed in the binding area 102.

Step S20, a second conductive material layer is formed on a side of the first conductive layer 20 away from the substrate 10, and patterned to obtain the signal wiring 30 disposed at least in the binding area 102. The signal wiring 30 includes the binding connection portion 31 disposed on a side of the additional conductive portion 21 away from the substrate 10. At least one side surface of the additional conductive portion 21 protrudes from a side surface of the binding connection portion 31 along the first direction. The first direction X is parallel to the substrate 10 and perpendicular to the extension direction of the signal wiring 30.

At step S20, the insulation layer 42 and the second conductive layer are sequentially formed on a side of the first conductive layer 20 away from the substrate 10.

Then, the second conductive material layer is patterned to form the source and the drain disposed in the display area 101, and the signal wiring 30 disposed at least in the binding area 102, and at least the source, the drain, and the signal wiring 30 form the second conductive layer. It should be noted that the signal wiring 30 may also extend into the bending area, the fanout wiring area, and even the display area 101, so as to transmit signals to the display area 101. Or, the signal wiring 30 may also be connected to the wirings of the display device in the display area 101 through a via hole, or through other methods to achieve the signal transmission, which is not limited here.

Optionally, the material of the second conductive layer may be copper.

The signal wiring 30 includes the binding connection portion 31 disposed in the binding area 102, and the binding connection portion 31 is disposed on a side of the additional conductive portion 21 away from the substrate 10. The insulation layer 42 includes the first insulation sub-layer 421 disposed between the binding connection portion 31 and the additional conductive portion 21.

It should be noted that the semiconductor layer may further be formed between the insulation layer 42 and the second conductive layer at step S10, and the semiconductor layer includes the active layer disposed in the display area 101. The insulation layer 42 may further include the second insulation sub-layer disposed between the gate and the active layer.

In the embodiment of the present disclosure, the first direction X is defined to be parallel to the substrate 10 and perpendicular to the extension direction of the signal wiring 30. Because the second conductive layer may be formed by multiple wet etching processes, the side etching of the second conductive layer is prone to occur, resulting in the width of the signal wiring 30 being smaller than the preset width of the signal wiring 30, causing the width of the opening 410 along the first direction X to be greater than the width of the binding connection 31 along the first direction X.

Step S30, a spacing material layer is formed on a side of the second conductive layer away from the first conductive layer 20, and patterned to obtain the spacing layer 41, in which the opening 410 is formed at least above the binding connection portion 31.

At step S30, the spacer layer 41 may be an insulation layer and/or a planarization layer in the display area 101.

Optionally, the spacer layer 41 may be a polymer film.

At step S30, the spacing material layer is patterned to form the spacing layer 41 having the opening 410 above the binding connection portion 31. In the embodiment of the present disclosure, at least one side surface of the additional conductive portion 21 protrudes from the side surface of the binding connection portion 31 along the first direction X. In the process of forming the opening 410, when the width of the opening 410 along the first direction X is greater than the width of the binding connection portion 31 along the first direction X, a part of the insulation layer 42 in the area corresponding to the opening 410 is removed to expose the part of the additional conductive portion 21 protruding from the side surface of the binding connection portion 31. That is, the opening 410 further passes through the insulation layer 42. A part of the insulation layer 42 disposed between the additional conductive portion 21 and the binding connection portion 31 is not removed, forming the first insulation sub-layer 421 disposed between the additional conductive portion 21 and the binding connection portion 31.

Step S40, a third conductive material layer is formed on a side of the spacing layer 41 away from the second conductive layer, and patterned to obtain the third conductive layer 50, in which the binding electrode 51 disposed in the binding area 102 is formed. The binding electrode 51 extends into the opening 410. The binding electrode 51 is connected to either the binding connection portion 31, or both of the binding connection portion 31 and the additional conductive portion 21.

At step S40, the third conductive material layer is patterned to form the pixel electrode disposed in the display area 101 and connected to the drain or the source, and the binding electrode 51 disposed in the binding area 102.

The opening 410 expose the binding connection portion 31, and the binding electrode 51 extends into the opening 410 to be connected to the binding connection portion 31.

When the position of the opening 410 deviates or the width of the opening 410 along the first direction X is greater than the width of the binding connection portion 31 along the first direction X, the binding electrode 51 is connected to the binding connection portion 31 and the additional conductive portion 21 in the opening 41. That is, the binding electrode 51 can be connected to the additional conductive portion 21 on the basis of being connected to the binding connection portion 31, so that the binding electrode 51 is connected to both of the binding connection portion 31 and the additional conductive portion 21, which increases the contact effect of the binding electrode 51 and the signal wiring 30, reduces the connection resistance between the binding electrode 51 and the signal wiring 30, and improves the signal transmission effect.

Optionally, the material of the third conductive layer 50 may be indium tin oxide.

In some embodiments, a 4Mask process is used for the manufacturing method of the display device, in which the first conductive layer 20 may be obtained using a first photomask, the second conductive layer and the semiconductor layer may be obtained using a second photomask, the spacer layer 41 including the opening 410 may be obtained using a third photomask, and the third conductive layer 50 may be obtained using a fourth photomask. Compared to the prior art, the embodiments of the present disclosure ensure the contact effect between the binding connection portion 31 and the binding electrode 51 on the basis of using copper as the material of the signal wiring 30, achieves the preparation of the display device by the 4Mask process, and further simplifies the processes and reduces the costs.

Moreover, in the subsequent processes, the conductive material layer including the conductive material such as silver paste and/or solder paste may be formed on the binding electrode 51, and the driver chip can be connected to the binding electrode 51 through the conductive material layer.

In view of foregoing, the embodiments of the present disclosure, by disposing the additional conductive portion 21 below the binding connection portion 31, and the additional conductive portion 21 protruding from the binding connection portion 31 in the direction parallel to the substrate 10 and perpendicular to the extension direction of the signal wiring 30, enables the opening 410 to expose the binding connection portion 31 and a protrusion part of the additional conductive portion 21 below the binding connection portion 31 on a condition that a size of the opening 410 is greater than a width of the binding connection portion 31 or the position of the opening 410 has deviation during the process of forming the opening 410, so that the binding electrode 51 can be connected to the additional conductive portion 21 on the basis of being connected to the binding connection portion 31, that is, the binding electrode 51 can be connected to both of the binding connection portion 31 and the additional conductive portion 21, which increase the contact area to increase the effective binding area, reduce the connection resistance between the binding electrode 51 and the signal wiring 30, and improve the signal transmission effect.

In the above-mentioned embodiments, the description of each embodiment has its own emphasis. For the parts that are not detailed in one embodiment, please refer to the relevant descriptions of other embodiments.

The display device provided by the embodiments of the present disclosure are described in detail. In this paper, specific embodiments are adopted to illustrate a principle and implementation modes of the present disclosure. The description of the above-mentioned embodiments is only used to help understand methods and a core idea of the present disclosure. At the same time, for those skilled in the art, of the idea of the present disclosure, there will be changes in specific implementation modes and a scope of the present disclosure. In conclusion, contents of the specification should not be interpreted as a limitation of the present disclosure.

What is claimed is:

1. A display device comprising a display area and a binding area disposed at at least one side of the display area, wherein the display device further comprises:
a substrate;
a first conductive layer disposed on the substrate, and comprising an additional conductive portion disposed in the binding area;
a second conductive layer disposed on a side of the first conductive layer away from the substrate, and comprising a signal wiring disposed at least in the binding area, wherein the signal wiring comprises a binding connection portion disposed on a side of the additional conductive portion away from the substrate;
a spacing layer disposed on a side of the second conductive layer away from the first conductive layer, and comprising an opening disposed at least above the binding connection portion; and
a third conductive layer disposed on a side of the spacing layer away from the second conductive layer, and comprising a binding electrode disposed in the binding area;
wherein at least one side surface of the additional conductive portion protrudes from a side surface of the binding connection portion along a first direction, and the first direction is parallel to the substrate and perpendicular to an extension direction of the signal wiring; and wherein the binding electrode extends into the opening, and is connected to either the binding connection portion, or both of the binding connection portion and the additional conductive portion.

2. The display device of claim 1, wherein an orthographic projection of the binding connection portion on the substrate is located within an orthographic projection of the additional conductive portion on the substrate.

3. The display device of claim 2, wherein a width of the additional conductive portion along the first direction is greater than or equal to a width of the opening at a side of the substrate along the first direction.

4. The display device of claim 2, wherein a width of the additional conductive portion along the first direction is greater than or equal to 8 microns.

5. The display device of claim 1, wherein an orthographic projection of the binding connection portion on the substrate partially overlaps with an orthographic projection of the additional conductive portion on the substrate.

6. The display device of claim 5, wherein the binding connection portion comprises a first side surface and a second side surface disposed opposite to each other along the first direction, and the additional conductive portion comprises a third side surface and a fourth side surface disposed opposite to each other along the first direction; and
wherein along the first direction, the first side surface is disposed at a side of the third side surface away from the fourth side surface, and the fourth side surface is disposed at a side of the second side surface away from the first side surface.

7. The display device of claim 1, wherein the binding electrode covers at least a part of a surface of the binding connection portion away from the substrate.

8. The display device of claim 1, wherein the binding electrode covers at least a part of a surface of the binding connection portion away from the substrate, and a part of a surface of the additional conductive portion away from the substrate.

9. The display device of claim 1, wherein the second conductive layer comprises at least two signal wirings; and wherein between adjacent two signal wirings, an orthographic projection of the additional conductive portion between one of the adjacent two signal wirings and the substrate on the substrate does not overlap with an orthographic projection of another of the adjacent two signal wirings on the substrate.

10. The display device of claim 1, further comprising an insulation layer disposed between the first conductive layer and the second conductive layer; wherein the first conductive layer further comprises a gate disposed in the display area, the second conductive layer further comprises a source and a drain disposed in the display area, and the third conductive layer further comprises a pixel electrode disposed in the display area; and wherein the insulation layer comprises a first insulation sub-layer disposed between the additional conductive portion and the binding connection portion, and a second insulation sub-layer covering the gate.

11. The display device of claim 10, wherein the opening further passes through the insulation layer, and the binding electrode is connected to the additional conductive portion via the opening.

12. The display device of claim 1, wherein a width of the binding connection portion along the first direction is greater than 3 microns and less than 10 microns.

13. The display device of claim 1, wherein a material of the second conductive layer is copper.

14. A display device comprising a display area and a binding area disposed at at least one side of the display area, wherein the display device further comprises:
a substrate;
a first conductive layer disposed on the substrate, and comprising an additional conductive portion disposed in the binding area;
a second conductive layer disposed on a side of the first conductive layer away from the substrate, and comprising a signal wiring disposed at least in the binding area, wherein the signal wiring comprises a binding connection portion disposed on a side of the additional conductive portion away from the substrate;
a spacing layer disposed on a side of the second conductive layer away from the first conductive layer, and comprising an opening disposed at least above the binding connection portion; and
a third conductive layer disposed on a side of the spacing layer away from the second conductive layer, and comprising a binding electrode disposed in the binding area;

wherein at least one side surface of the additional conductive portion protrudes from a side surface of the binding connection portion along a first direction, and the first direction is parallel to the substrate and perpendicular to an extension direction of the signal wiring; and wherein the binding electrode extends into the opening, and is connected to either the binding connection portion, or both of the binding connection portion and the additional conductive portion; and wherein the binding electrode covers at least part or all of a surface of the binding connection portion away from the substrate.

15. The display device of claim 14, wherein an orthographic projection of the binding connection portion on the substrate is located within an orthographic projection of the additional conductive portion on the substrate.

16. The display device of claim 15, wherein a width of the additional conductive portion along the first direction is greater than or equal to a width of the opening at a side of the substrate along the first direction.

17. The display device of claim 15, wherein a width of the additional conductive portion along the first direction is greater than or equal to 8 microns.

18. The display device of claim 14, wherein an orthographic projection of the binding connection portion on the substrate partially overlaps with an orthographic projection of the additional conductive portion on the substrate.

19. The display device of claim 18, wherein the binding connection portion comprises a first side surface and a second side surface disposed opposite to each other along the first direction, and the additional conductive portion comprises a third side surface and a fourth side surface disposed opposite to each other along the first direction; and wherein along the first direction, the first side surface is disposed at a side of the third side surface away from the fourth side surface, and the fourth side surface is disposed at a side of the second side surface away from the first side surface.

20. The display device of claim 14, wherein the binding electrode covers at least a part of a surface of the binding connection portion away from the substrate, and a part of a surface of the additional conductive portion away from the substrate.

* * * * *